(12) United States Patent  
Parten

(10) Patent No.: US 11,820,916 B2  
(45) Date of Patent: Nov. 21, 2023

(54) COMPOSITE ARTICLE WITH LIGHTNING STRIKE PROTECTION AND METHOD AND RELEASE FILM FOR FORMING SAME

(71) Applicant: Wichita State University, Wichita, KS (US)

(72) Inventor: Clay Parten, Wichita, KS (US)

(73) Assignee: WICHITA STATE UNIVERSITY, Wichita, KS (US)

( * ) Notice: Subject to any disclaimer, the term of this patent is extended or adjusted under 35 U.S.C. 154(b) by 226 days.

(21) Appl. No.: 17/331,831

(22) Filed: May 27, 2021

(65) Prior Publication Data

US 2021/0371677 A1 Dec. 2, 2021

Related U.S. Application Data

(60) Provisional application No. 63/032,053, filed on May 29, 2020.

(51) Int. Cl.
*C09D 5/24* (2006.01)
*B05D 1/02* (2006.01)
(Continued)

(52) U.S. Cl.
CPC ............. *C09D 5/24* (2013.01); *B05D 1/02* (2013.01); *H01B 1/22* (2013.01); *H05K 9/0079* (2013.01); *H05K 9/0083* (2013.01)

(58) Field of Classification Search
CPC ........ B05D 1/02; B05D 2601/28; B05D 5/12; C09D 5/24; H01B 1/22; H05K 9/0079; H05K 9/008
See application file for complete search history.

(56) References Cited

U.S. PATENT DOCUMENTS 7,896,616 B2 3/2011 Livingston et al.
9,481,157 B2 11/2016 Ackerman et al.
(Continued)

FOREIGN PATENT DOCUMENTS

CN 102661240 A1 9/2012
WO 2011080177 A1 7/2011
(Continued)

OTHER PUBLICATIONS

Extended European Search Report in Application No. 18171042.7, dated Oct. 2, 2018, 9 pages.

*Primary Examiner* — Mark Kopec
*Assistant Examiner* — Jaison P Thomas
(74) *Attorney, Agent, or Firm* — Stinson LLP

(57) ABSTRACT

A composite article includes a lightning strike protection coating on a composite substrate. The lightning strike protection coating is formed from electrically conductive material and includes protrusions spaced along the length and width of a portion of the substrate surface. To form the lightning strike protection coating, a form is pressed against electrically conductive coating material on the composite substrate while the electrically conductive coating material is flowable. For example, the form can be a release film used in a composite vacuum bagging process. Suitable release film can have depressions along an inner surface that define an imprint of the coating protrusions. After curing, the coating can be covered with a layer of paint that conceals the protrusions but still allows lightning streamers to penetrate the paint at the protrusions.

44 Claims, 4 Drawing Sheets

(51) Int. Cl.
*H05K 9/00* (2006.01)
*H01B 1/22* (2006.01)

(56) References Cited

U.S. PATENT DOCUMENTS

| | | |
|---|---|---|
| 2008/0181775 A1 | 7/2008 | Livingston et al. |
| 2010/0108342 A1 | 5/2010 | Shimp et al. |
| 2010/0209690 A1* | 8/2010 | Sang .................. C09D 163/00 428/221 |
| 2010/0263898 A1* | 10/2010 | Hebert .................. H02G 13/80 174/2 |
| 2011/0186206 A1 | 8/2011 | Ackerman et al. |
| 2013/0048331 A1* | 2/2013 | Fornes .................. B64D 45/02 174/2 |
| 2013/0105190 A1 | 5/2013 | Knyazev |
| 2013/0271891 A1 | 10/2013 | Shimp et al. |
| 2013/0309579 A1 | 11/2013 | Shimp et al. |

FOREIGN PATENT DOCUMENTS

| | | |
|---|---|---|
| WO | 20140124642 A1 | 8/2014 |
| WO | 2014200333 A1 | 12/2014 |
| WO | 2015055215 A1 | 4/2015 |

* cited by examiner

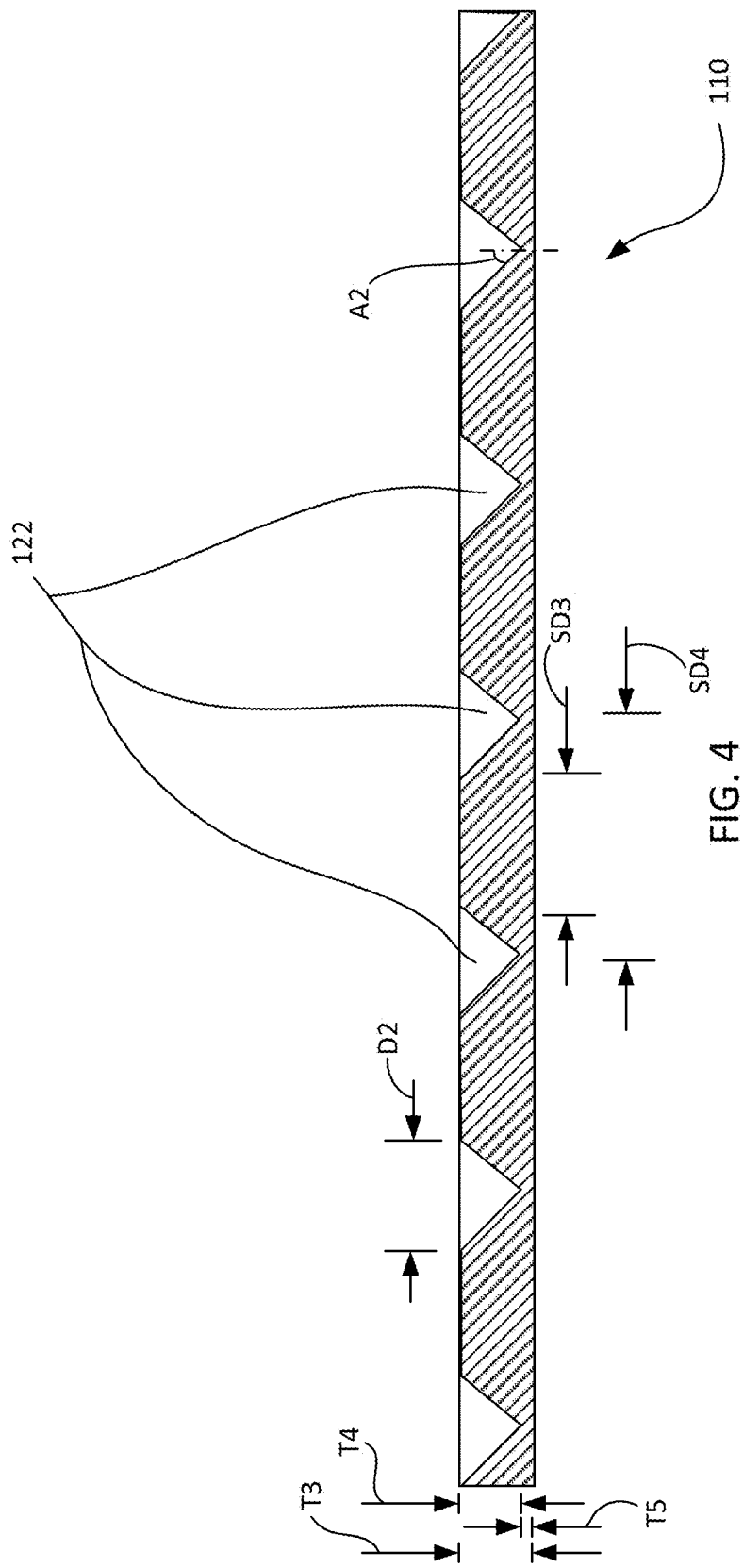

US 11,820,916 B2

COMPOSITE ARTICLE WITH LIGHTNING STRIKE PROTECTION AND METHOD AND RELEASE FILM FOR FORMING SAME

CROSS-REFERENCE TO RELATED APPLICATION

This application claims priority to U.S. Provisional Patent Application No. 63/032,053, filed May 29, 2020, which is hereby incorporated by reference in its entirety.

FIELD

The present disclosure generally relates to a composite article including a lightning strike protection coating, a method of forming a lightning strike protection coating on a composite article, and a release film for forming a lightning strike protection coating on a composite article.

BACKGROUND

Outdoor composite structures are vulnerable to lightning strikes. For example, composite aircraft and composite wind turbine blades are known lightning strike risks. Various lightning strike protection (LSP) systems have been proposed and implemented for composite articles deployed in outdoor environments.

For composite aircraft, suitable LSP provides an electrically conductive path that extends continuously along the entire aircraft exterior. SAE ARP5414B, 2018 defines the standard assessment of the risk of lightning strike at different zones of the aircraft exterior. The amount/type of conductive material is varied in accordance with the probabilities of lightning strikes of given amounts of electrical current at the zone where the material is applied.

For most composite aircraft currently on the market, the preferred LSP is a discrete layer of metal mesh or expanded metal foil that is co-consolidated with the composite material as exterior aircraft parts are formed. Alternatively, it has been proposed to weave individual wires of conductive material directly into the fibers of the substrate or to deposit conductive coatings directly onto raw carbon-fibers or other reinforcing fibers before they are consolidated into composite parts. However, metal cannot be integrated into thermoplastic composites that are to be joined by induction welding. Thus, for induction welded exterior aircraft parts the conductive path for LSP must be formed another way—specifically, the conductive material must not be applied until after the induction welding is complete, e.g., as a post-consolidation, post-welding process.

For induction welded thermoplastic aircraft parts, the most widely adopted solution currently is a spray-on LSP coating sold by Socomore under the name Ultra-Conductive Coating. Aspects of this Ultra-Conducting Coating are described in U.S. Patent Application Publication No. 20170226351A9, which is hereby incorporated by reference in its entirety and for all purposes.

SUMMARY

In one aspect, a method of applying lightning strike protection to a composite article comprises applying an electrically conductive coating onto the composite article in flowable form. A form is pressed against the electrically conductive coating applied on the composite article while the electrically conductive coating is flowable. The form comprises a plurality of spaced apart depressions. The electrically conductive coating is cured while the form is pressed against the electrically conductive coating on the composite article to create an impression of the form in the electrically conductive coating that includes a plurality of spaced apart protrusions.

In another aspect, a composite article comprises a composite substrate and a lightning strike protection coating covering a surface portion of the composite substrate. The lightning strike protection coating comprises an electrically conductive material and includes a plurality of spaced apart protrusions along the surface portion.

In still another aspect, a release film for use in forming a lightning strike protection coating on a composite article comprises an inner surface having a plurality of depressions spaced apart along a length and a width of the inner surface. Each of the depressions have one of a conical shape and a pyramidal shape. The inner surface is made of material that is configured to release from the lightning strike protection coating after being pressed against the lightning strike protection coating while the lightning strike protection coating cures on the composite article such that an impression of the inner surface is formed on the lightning strike protection coating.

Other aspects will be in part apparent and in part pointed out hereinafter.

BRIEF DESCRIPTION OF THE DRAWINGS

FIG. 4 is a schematic cross-section taken in the plane of line 4-4 of FIG. 3.

Corresponding reference numbers indicate corresponding parts throughout the drawings.

DETAILED DESCRIPTION

The inventor has recognized that existing spray-on LSP coatings can have substantially less protective effect than co-consolidated plies formed from metal mesh or expanded metal foil. Whereas co-consolidated metal LSP plies can be formed from essentially monolithic metal that extends contiguously along large surface areas, spray-on LSP coatings of the type disclosed in U.S. Patent Application Publication No. 20170226351A9 and sold by Socomore under the name Ultra-Conductive Coating are formed from metal particles (e.g., flakes or granules) held together in a polymer matrix. As a result, electrical current is distributed through the coating along the exterior of the composite part by moving through the contact interfaces between adjacent metal particles. This dynamic introduces a substantial amount of contact resistance that is not present in certain co-consolidated LSP plies. Due in part to contact resistance, LSP coatings are inherently less electrically conductive and more electrically resistive than co-consolidated meshes and foils employing the same metal materials. As a result, post-consolidation LSP coatings provide less effective protection than co-consolidated metal plies. For example, the same lightning strike that would disperse through a co-consolidated metal ply without damaging the substrate might create enough resistive heating (e.g., due to contact resistance) in the immediate vicinity of the strike entry point to damage the composite substrate when a conventional, particulate, post-consolidation LSP coating is used instead. As will be explained in further detail below, the present disclosure provides an LSP coating, as well as methods and devices for forming same, that can mitigate the adverse effects of contact resistance by using the Corona effect to distribute the current at the entry point of the lightning strike. It is believed that the techniques described herein can be used to enhance the effectiveness of many types of LSP layers, even those that may have an entirely different composition that mitigates internal contact resistance in some other way. In other words, the performance benefits of the techniques described below may accrue to any type of particulate LSP coating, regardless of composition. Thus, it is contemplated that any type of LSP coating may be used without departing from the scope of this disclosure.

Figure 1:
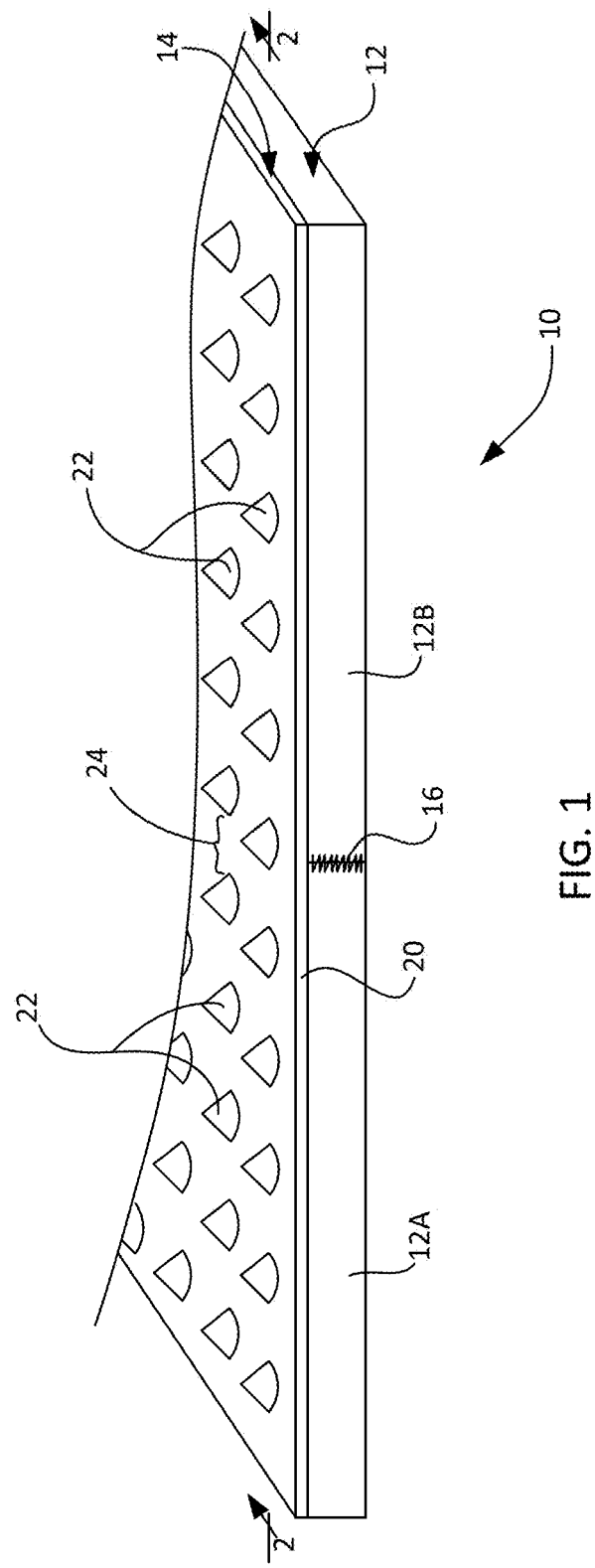
FIG. 1 is a fragmentary schematic illustration of an embodiment of a composite article including an LSP coating.
Figure 2:
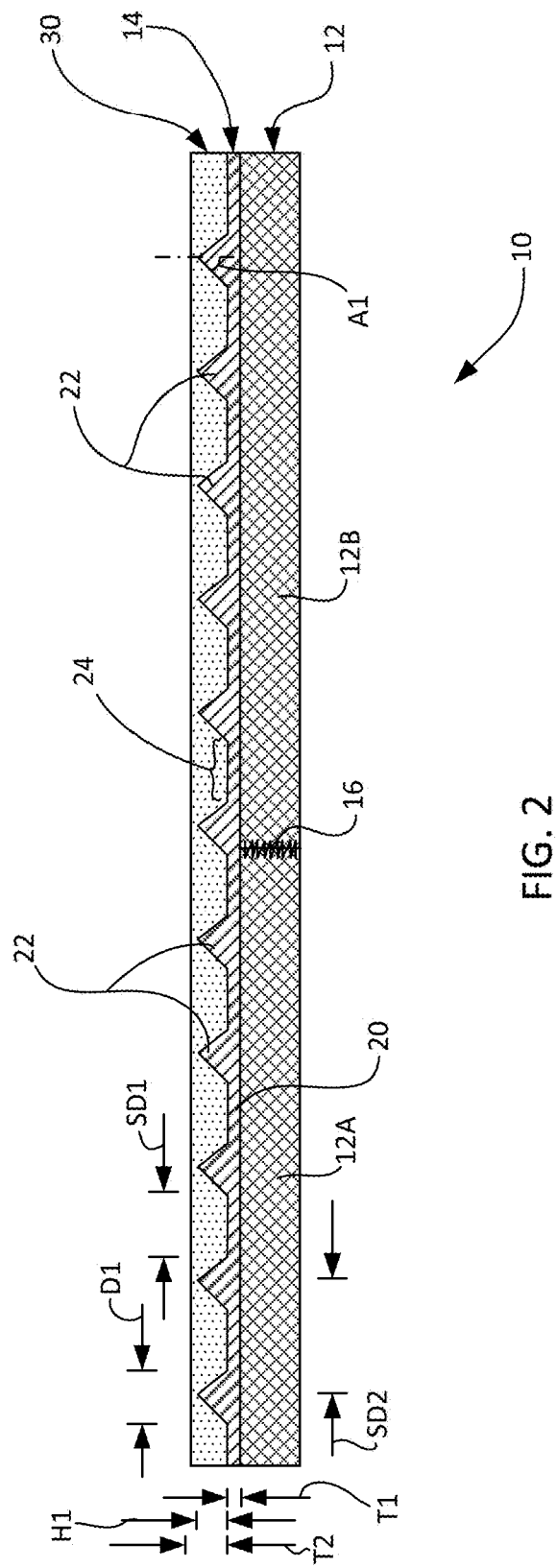
FIG. 2 is a schematic cross-section taken in the plane of line 2-2 of FIG. 1, and illustrating a paint layer applied onto the LSP coating.

Referring to FIGS. 1-2, one embodiment of a composite article protected from lightning strikes using techniques within the scope of this disclosure is shown schematically at reference number 10. The article 10 includes a composite substrate 12 and an LSP coating 14 on the composite substrate. As will be explained in further detail below, the LSP coating 14 can be applied to the substrate 12 after it is formed/consolidated. The LSP coating 14 need not be co-consolidated with the composite substrate 12.

Any suitable type of composite substrate in need of LSP can be used without departing from the scope of the disclosure. In an exemplary embodiment, the composite substrate 12 is a thermoplastic composite. In the illustrated embodiment, the composite substrate 12 is formed from a first composite piece 12A and a second composite piece 12B that are joined together at an induction weld 16. The induction weld 16 is suitably formed before application of the LSP coating 14. The composite substrate 12 may form a portion of any type of composite article used in an environment where the article is susceptible to lightning strikes, for example, an exterior portion of a rotary or fixed wing aircraft, a portion of a wind turbine blade, or the like. It is expressly contemplated that, in certain embodiments, the composite substrate 12 forms a portion of an aircraft exterior located at zone 2A as defined by SAE ARP5414B, 2018. However, it will be understood that composite substrates forming other portions of aircraft exteriors or other types of articles may be used within the scope of this disclosure.

The LSP coating 14 is formed from an electrically conductive material. To facilitate application in a post-consolidation (e.g., post-induction welding) operation, in an exemplary embodiment, the LSP coating 14 is formed from a material that can be applied in flowable form, e.g., a material that can be sprayed onto the surface of the substrate 12 as a liquid. In an exemplary embodiment, the LSP coating 14 comprises metal particles (e.g., silver or copper particles) dispersed in a polymer matrix such that the metal particles contact each other to form an electrically conductive network of metal in continuous contact along substantially the entire surface area of the coating. It is also contemplated that other types of conductive material (e.g., carbon nanotubes, graphene) may be used in lieu of or in addition to metal. Furthermore, it is conceivable that the entire cross-section of the LSP coating 14 can be formed from conductive material such that the coating is devoid of an electrically insulating polymer matrix material. Suitable materials for the LSP coating 14 are disclosed in U.S. Patent Application Publication No. 2017/0226351A9, which has been incorporated by reference into this disclosure. An exemplary, market-ready product that may be used to form the LSP coating 14 is Ultra-Conductive Coating, sold by Socomore.

Even though conventional spray-on LSP compositions may be used to form the LSP coating 14, LSP coatings within the scope of this disclosure differ from conventional LSP coatings in their surface topography. The illustrated LSP coating 14 comprises a bottom portion 20 that covers the substrate 12 where the coating is applied and a plurality of protrusions 22 spaced apart along the surface area of the coating. The bottom portion 20 suitably has a substantially constant thickness T1. In one or more embodiments the thickness T1 is in an inclusive range of from about 1 mils to about 2 mils. In the illustrated embodiment, the protrusions 22 are spaced apart along the length and width (broadly, two perpendicular dimensions) of the coating in an equidistant two-dimensional grid pattern. Various two-dimensional grid or lattice patterns may be used for the protrusions 22 without departing from the scope of the disclosure. The spacing of the protrusions 22 provides flat regions 24 between the protrusions, the flat regions being defined by the outward facing surface of the bottom portion 20.

Suitably, each of the protrusions 22 has an outer end that comes to a point (e.g., has a pointed outer end). In the illustrated embodiment, each of the protrusions 22 has a conical shape. However, protrusions of other shapes are also contemplated within the scope of this disclosure. For example, in one more embodiments some or all of the conical protrusions 22 can be replaced with pyramidal protrusions (e.g., rectangular pyramids or pyramids having other polygonal cross-sectional shapes). In addition, in certain embodiments, the protrusions may not come to a sharp point at their outer ends. For example, protrusions that are dome-shaped and protrusions that do not substantially taper in cross-sectional shape as they extend outward are contemplated within the scope of the disclosure.

In the illustrated embodiment, each of the protrusions 22 has a maximum cross-sectional dimension D1 (e.g., outer diameter) at the base of the protrusion. In one or more embodiments, the maximum cross-sectional dimension D1 is in an inclusive range of from about 8 mils to about 40 mils. When the LSP coating 14 is used in a commercial aviation application (which typically includes paint applied at a thickness of less than 11 mils), in one or more embodiments, the maximum cross-sectional dimension is in an inclusive range of from about 8 mils to about 15 mils. When the LSP coating 14 is used in a general aviation application (which often includes paint applied at a thickness of on the order of 15 mils or 20 mils, or greater), in one or more embodiments, the maximum cross-sectional dimension D1 is in an inclusive range of from about 24 mils to about 40 mils. As will be apparent, depending on the chosen shape of the protrusion, the amount of paint that is to be applied over the LSP coating 14 (if any), and other factors, protrusions 22 having maximum cross-sectional dimensions D1 outside of the above-listed ranges are also possible without departing from the scope of the disclosure.

Each illustrated protrusion 22 also a height H1. The heights H1 of every protrusion 22 may be substantially the same as illustrated, or it is also contemplated that protrusions of varying heights may be used on other articles. In the illustrated embodiment, each of the protrusions 22 has a height H1 in an inclusive range of from about 4 mils to about 20 mils (e.g., an inclusive range of from about 4 mils to about 18 mils, an inclusive range of from about 4 mils to about 16 mils, an inclusive range of from about 4 mils to about 14 mils, an inclusive range of from about 4 mils to about 12 mils, an inclusive range of from about 4 mils to about 10 mils). When the LSP coating 14 is used in a commercial aviation application (which typically includes paint applied at a thickness of less than 11 mils), in one or more embodiments, the height H1 is in an inclusive range of from about 4 mils to about 7.5 mils. When the LSP coating 14 is used in a general aviation application (which often includes paint applied at a thickness of on the order of 15 mils or 20 mils, or greater), in one or more embodiments, the maximum cross-sectional dimension D1 is in an inclusive range of from about 12 mils to about 20 mils. As will be apparent, depending on the chosen shape of the protrusion, the amount of paint that is to be applied over the LSP coating 14 (if any), and other factors, protrusions 22 having heights H1 outside of the above-listed ranges are also possible without departing from the scope of the disclosure.

In the illustrated embodiment, each protrusion has a cone angle A1 in an inclusive range of from about 30° to about 60° (e.g., an inclusive range of from about 35° to about 55°, such as an angle of about 45°). The cone angle A1 (broadly, the pitch or slope) is measured as the included angle between the axis of the protrusion 22 and a side of the protrusion extending from the tip to the base.

In an exemplary embodiment, adjacent protrusions 22 are spaced apart from one another by a nearest spacing distance SD1 extending along the flat regions 24 that is one-times to two-times greater than the maximum cross-sectional dimension D1. For example, the nearest spacing distance SD1 can be in an inclusive range of from about 8 mils to about 80 mils. In certain embodiments, adjacent protrusions 22 are spaced apart from one another by an on-center (e.g., point-to-point) spacing distance SD2 that is about two-times to about three-times greater than the maximum cross-sectional dimension D1. In one or more embodiments, the on-center spacing distance SD2 is in an inclusive range of from about 16 mils to about 120 mils. Other protrusion spacing distances are also possible without departing from the scope of the disclosure.

Thus, it can be seen that the illustrated LSP coating 14 has a surface topography that includes a plurality of spaced apart elevated points, which as explained more fully below, during a lightning strike, may cause multiple streamers or leaders to form that carry only a fraction of the overall current load of the lightning strike and are distributed over a surface area of the LSP coating.

Referring to FIG. 2, the illustrated composite article further comprises a paint layer 30 on the lightning strike protection coating 14. Throughout this disclosure, the paint layer will be understood to include all sub-parts of paint, primer, and any additional top coat materials. Suitably, the paint layer 31 completely covers the LSP coating 14 so that none of the protrusions are visible through paint layer. As such, while the surface of the LSP coating 14 is not smooth, the paint layer 31 presents a smooth surface finish to observers of the article 10. However, while the visible surface of the paint layer 30 may be smooth, the pointed tips of the LSP protrusions 22 lie shallowly beneath the surface. In the illustrated embodiment, the paint layer 31 has a thickness T2 that is in an inclusive range of from about 5 mils to about 23 mils. Thus, in one or more embodiments, each of the protrusions has a height H1 that is about 1 mil to about 3 mils less than the thickness T2 of the paint layer 30.

The LSP coating 14 of the illustrated article 10 is thought to provide substantially improved LSP performance versus conventional LSP coatings formed from material of the same conductive composition. In particular, the inventor has discovered that the spaced apart conductive points defined by the protrusions 22 can create a Corona effect during a lightning strike. Each protrusion 22 in the area of the lightning strike acts like a small lightning rod or attraction point, and the many spaced apart attraction points cause multiple streamers or leaders to form that are distributed among a plurality of the discrete attraction points defined by the protrusions. Because the portion of the paint layer 30 covering the tips of the protrusions 22 is very thin, it does not substantially mitigate the Corona effect. In other words, the separate lightning streamers can penetrate the thin (e.g., 1 mil-thick to 3 mils-thick) paint above the pointed tips of the protrusions 22. The current is allowed to flow into the LSP coating 14 through separate parallel paths (discrete streamers), each entering at the tip of a respective protrusion 22. Each streamer carries only a fraction of the current of the entire lightning strike. Furthermore, the streamers distribute themselves over a much larger surface area than would a lightning strike imparted on a flat or smooth LSP coating topography. Thus, it can be seen that the composite article 10, and more specifically the LSP coating 14, is configured to induce a distributed arc root attachment upon being struck by lightning, and the distributed art root attachment effect may reduce the destructive effects to the composite substrate.

An exemplary method of forming an article 10 that includes the LSP coating 14 will now be described. As explained above, the LSP coating 14 can be applied as a fluid onto a pre-consolidated composite substrate 12. In one or more embodiments, the manufacturer forms two (or more) discrete composite thermoplastic pieces 12A, 12B and joins them together by induction welding to form the composite substrate 12 onto which the LSP coating 14 will be applied. However, it will be appreciated that the composite substrate onto which the LSP coating is applied may be formed in other ways.

When the underlying substrate 12 (e.g., the composite part or assembly) is complete, the manufacturer applies an electrically conductive fluid to at least a portion of the substrate surface in flowable form. In an exemplary embodiment, the manufacture sprays a liquid layer of electrically conductive fluid onto the substrate 12, e.g., an uncured liquid polymer binder containing metallic particles. Other flowable, electrically conductive materials may be applied, provided that shortly after application a three-dimensional surface topography may be impressed into the material and the material may subsequently be cured or otherwise made to hold its shape. In one or more embodiments, the conductive fluid is initially applied at a substantially constant thickness in an inclusive range of from about 3 mils to about 4 mils.

Figure 3:
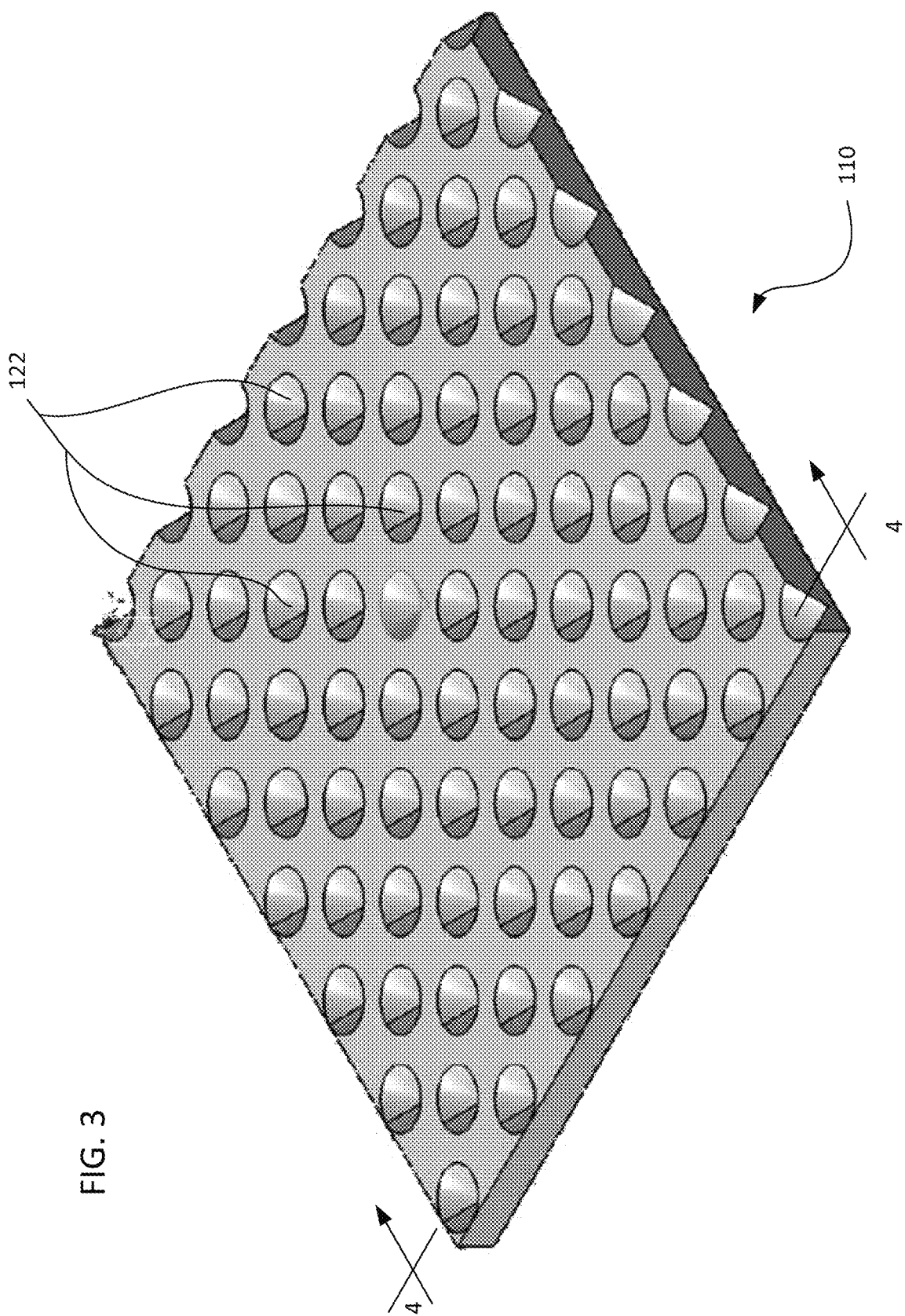
FIG. 3 is a schematic perspective of a segment of embossed release film that may be used to form the LSP coating of the composite article of FIG. 1.

After applying the conductive material in flowable form, the conductive material is shaped to have a plurality of spaced apart, upwardly protruding points configured for separating a lightning strike into distributed streamers in the event of a lightning strike. Broadly, the process of shaping the flowable conductive material comprises pressing a form against the material that includes a plurality of depressions having a size, shape, and arrangement that is a negative imprint of the intended surface topography. Although various types of forms may be used, in an exemplary embodiment illustrated in FIG. 3, the form comprises an embossed (or otherwise dimpled) release film or peel ply 110. The embossed release film 110 can be pressed onto the portion of the article 10 having the coating material 14 in a vacuum bagging process in the same general way that such processes are performed using conventional release films. In FIG. 3, a segment of embossed film no is shown in a laid-flat configuration. However, it will be understood that the film 110 is flexible so that it can be formed to substantially conform to the shape of virtually any composite article or substrate during the vacuum bagging process.

The embossed release film no is formed into or otherwise incorporated into a suitable vacuum bag that is then disposed over the article, evacuated, and subsequently held in place under vacuum pressure while the conductive material is cured. The conductive material is thereby formed to have a three-dimensional surface topography including an impression of the embossed film no. Curing may occur at ambient conditions or under applied heat and/or applied electromagnetic radiation (e.g., ultraviolet light), depending on the type of material used to form the LSP coating 14. Curing the conductive material while pressing the embossed film no (broadly, the form) against the material forms an impression of the embossed film in the coating 14. In the illustrated embodiment, the film 110 is configured to leave an impression that includes the protrusions 22 and flat regions 24 as illustrated in FIGS. 1 and 2 and described above.

Those skilled in the art will thus appreciate that the release film no can have any composition that is suitable for releasing or peeling away from the conductive material used to form the coating 14 after the coating cures. For example, in one or more embodiments, the LSP coating 14 comprises an epoxy resin and the release film no comprises a nylon or polyester treated with a suitable release agent.

Referring to FIGS. 3 and 4, the release film no has a thickness T3 that includes an inner portion T4 and an outer portion T5. The outer portion T5 of the thickness T3 defines an imperforate layer extending contiguously along the length and width (broadly, two perpendicular dimensions) of the release film. By contrast, the inner portion T4 of the thickness T3 defines a plurality of depressions 122 spaced apart along the length and width of the release film no. Each illustrated depression 122 also has a depth equal to the inner portion thickness T4, which in one or more embodiments, is in an inclusive range of from about 4 mils to about 20 mils. In the illustrated embodiment, the depressions 122 are spaced apart along the length and width of the release film no in an equidistant two-dimensional grid. Again, various two-dimensional grid or lattice patterns may be used for the depressions 122 without departing from the scope of the disclosure.

Since the inner surface of the illustrated film 110 defines a negative imprint of the LSP coating 14, it can be seen that in the illustrated embodiment each of the depressions 122 is generally conical in shape and has a large base end opening through the inner surface of the film no and a pointed outer end. It will be apparent based on the discussion of protrusion shapes above that other shapes besides cones are also contemplated within the scope of this disclosure, including, but not limited to, various pyramidal shapes. Preferably the depressions 122 are shaped so that the film no can release from the LSP coating 14 after it cures without significant interference from the protrusions 22. Thus, in one or more exemplary embodiments, each depression 122 has a cross-sectional shape that tapers as it extends from a base end opening through the inner side of the film no to an opposing outer pointed end adjacent the outer side of the film.

Each of the illustrated depressions 122 has a maximum cross-sectional dimension D2 (e.g., inner diameter) at the base (inner end) of the depression. In one or more embodiments, the maximum cross-sectional dimension D2 is in an inclusive range of from about 8 mils to about 40 mils. In the illustrated embodiment, each depression 122 has a cone angle A2 (included angle between an axis and a side wall of the cone) in an inclusive range of from about 30° to about 60° (e.g., an inclusive range of from about 35° to about 55°, such as an angle of about 45°). In an exemplary embodiment, adjacent depressions 122 are spaced apart from one another by a nearest spacing distance SD3 that is two-times to three-times greater than the maximum cross-sectional dimension D2. For example, the nearest spacing distance SD3 can be in an inclusive range of from about 16 mils to about 36 mils. The pointed tips of adjacent depressions 122 can be spaced apart by an on-center spacing distance SD4 in an inclusive range of from about 16 mils to about 48 mils in one or more embodiments. In certain embodiments, the on-center spacing distance SD4 is two-times to three-times greater than the maximum cross-sectional dimension D2.

Thus, as can be seen, by pressing the embossed film 110 against the conductive conformable material as it cures, the film can be used as a form that shapes the conformable conductive material to have a three-dimensional topography that includes a plurality of spaced apart pointed protrusions 22 at the locations of the depressions 122. For example, using a vacuum bagging technique to press the embossed film 110 against the conductive material while the material remains in a flowable state will cause some of the flowable material to extrude into each of the depressions. Then when the material cures, an imprint of the film is left on the conductive material. Although the illustrated film 110 has been described as being embossed with the depressions 122, it will be understood that other techniques for forming a grid or lattice of depressions that are spaced apart along a length and width of a section of film may be used to form suitable release films within the scope of this disclosure.

Accordingly, in the method of forming the LSP coating 14, the composite article is coated with a flowable conductive coating material, vacuum bagged using the embossed release film no, and cured before releasing the film from the article. Upon release of the film 110, the cured conductive coating 14 includes an impression of the depressions 122, a plurality of spaced apart pointed protrusions 22. As explained above, these protrusions 22 are believed to substantially enhance the LSP effect of the coating 14. As an added benefit, the vacuum bagging process compresses the conductive coating material as it cures, which is thought to reduce the contact resistance of the coating 14.

After the coating 14 is formed and the release film 110 is removed, the optional paint layer 30 is applied using any suitable method of paint application that is known now or may become known. The paint layer 30 is suitably applied at a thickness T2 that only barely covers the tips of the protrusions 22, e.g., at a thickness that enables the protrusions to function as separate lightning attraction points to cause streamering in the event of a lightning strike. Suitably, the pointed tips of the protrusions 22 are spaced apart from the outer paint surface by a thickness of from about 1 mil to about 3 mils. As an added benefit, the protrusions 14 provide a visual marker that ensures that the paint is applied evenly at the correct thickness. The painter sprays on the paint until the paint layer 30 slightly covers the tips of all of the protrusions.

When introducing elements of the present disclosure or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the disclosure are achieved and other advantageous results attained.

As various changes could be made in the above products and methods without departing from the scope of the disclosure, it is intended that all matter contained in the above description shall be interpreted as illustrative and not in a limiting sense.

What is claimed is:

1. A method of applying lightning strike protection to a composite article, the method comprising:
   applying an electrically conductive coating onto the composite article in flowable form;
   pressing a film against the electrically conductive coating applied on the composite article while the electrically conductive coating is flowable, the film comprising a plurality of spaced apart depressions; and
   curing the electrically conductive coating while the film is pressed against the electrically conductive coating on the composite article to create an impression of the film in the electrically conductive coating that includes a plurality of spaced apart protrusions.

2. The method as set forth in claim 1, wherein the film comprises an embossed film.

3. The method as set forth in claim 1, wherein each of the depressions has a pointed tip.

4. The method as set forth in claim 1, wherein the conductive coating comprises metal particles dispersed in a resin system.

5. The method of claim 1, wherein each of the depressions has a pointed tip and each of the depressions is a conical depression having a cone angle in an inclusive range of from about 30° to about 60°.

6. The method of claim 1, wherein each of the depressions has a pointed tip, a base, and a maximum cross-sectional dimension along the base of from about 8 mils to about 40 mils.

7. The method of claim 1, wherein each of the depressions has a pointed tip, a base, and a maximum cross-sectional dimension along the base, wherein adjacent depressions are spaced apart from one another by an on-center spacing distance that is two-times to three-times greater than the maximum cross-sectional dimensions.

8. The method of claim 1, wherein each of the depressions has a pointed tip and a depth of from about 4 mils to about 20 mils.

9. The method of claim 1, wherein each of the depressions is a conical depression having a cone angle in an inclusive range of from about 30° to about 60° and has a base and a maximum cross-sectional dimension along the base of from about 8 mils to about 40 mils.

10. The method of claim 1, wherein each of the depressions is a conical depression having a cone angle in an inclusive range of from about 30° to about 60° and has a base and a maximum cross-sectional dimension along the base, wherein adjacent depressions are spaced apart from one another by an on-center spacing distance that is two-times to three-times greater than the maximum cross-sectional dimensions.

11. The method of claim 1, wherein each of the depressions is a conical depression having a cone angle in an inclusive range of from about 30° to about 60° and has a depth of from about 4 mils to about 20 mils.

12. The method of claim 1, wherein each of the depressions has a base and a maximum cross-sectional dimension along the base of from about 8 mils to about 40 mils, wherein adjacent depressions are spaced apart from one another by an on-center spacing distance that is two-times to three-times greater than the maximum cross-sectional dimensions.

13. The method of claim 1, wherein each of the depressions has a base and a maximum cross-sectional dimension along the base of from about 8 mils to about 40 mils and a depth of from about 4 mils to about 20 mils.

14. The method of claim 1, wherein each of the depressions has a base and a maximum cross-sectional dimension along the base, wherein adjacent depressions are spaced apart from one another by an on-center spacing distance that is two-times to three-times greater than the maximum cross-sectional dimensions and has a depth of from about 4 mils to about 20 mils.

15. A method of applying lightning strike protection to a composite article, the method comprising:
   applying an electrically conductive coating onto the composite article in flowable form;
   pressing a form against the electrically conductive coating applied on the composite article while the electrically conductive coating is flowable, the form comprising a plurality of spaced apart depressions; and
   curing the electrically conductive coating while the form is pressed against the electrically conductive coating on the composite article to create an impression of the form in the electrically conductive coating that includes a plurality of spaced apart protrusions;
   wherein each of the depressions comprises a conical depression having a cone angle in an inclusive range of from about 30° to about 60°.

16. A method of applying lightning strike protection to a composite article, the method comprising:
   applying an electrically conductive coating onto the composite article in flowable form;
   pressing a form against the electrically conductive coating applied on the composite article while the electrically conductive coating is flowable, the form comprising a plurality of spaced apart depressions; and
   curing the electrically conductive coating while the form is pressed against the electrically conductive coating on the composite article to create an impression of the form in the electrically conductive coating that includes a plurality of spaced apart protrusions;
   wherein each of the depressions has a base and a maximum cross-sectional dimension along the base of from about 8 mils to about 40 mils.

17. A method of applying lightning strike protection to a composite article, the method comprising:
   applying an electrically conductive coating onto the composite article in flowable form;
   pressing a form against the electrically conductive coating applied on the composite article while the electrically conductive coating is flowable, the form comprising a plurality of spaced apart depressions; and
   curing the electrically conductive coating while the form is pressed against the electrically conductive coating on the composite article to create an impression of the form in the electrically conductive coating that includes a plurality of spaced apart protrusions;
   wherein each of the depressions has a base and a maximum cross-sectional dimension along the base, wherein adjacent depressions are spaced apart from one another by an on-center spacing distance that is two-times to three-times greater than the maximum cross-sectional dimensions.

18. A method of applying lightning strike protection to a composite article, the method comprising:

applying an electrically conductive coating onto the composite article in flowable form;

pressing a form against the electrically conductive coating applied on the composite article while the electrically conductive coating is flowable, the form comprising a plurality of spaced apart depressions; and curing the electrically conductive coating while the form is pressed against the electrically conductive coating on the composite article to create an impression of the form in the electrically conductive coating that includes a plurality of spaced apart protrusions;

wherein each of the depressions has a depth of from about 4 mils to about 20 mils.

19. A method of applying lightning strike protection to a composite article, the method comprising:

applying an electrically conductive coating onto the composite article in flowable form;

pressing a form against the electrically conductive coating applied on the composite article while the electrically conductive coating is flowable, the form comprising a plurality of spaced apart depressions; and curing the electrically conductive coating while the form is pressed against the electrically conductive coating on the composite article to create an impression of the form in the electrically conductive coating that includes a plurality of spaced apart protrusions;

applying a paint layer to the composite article over the electrically conductive coating, the paint layer having a thickness and each of the depressions having a depth that is about 1 mil to about 3 mils less than the thickness of the paint layer.

20. A method of forming a composite article comprising:

induction welding a first composite piece to a second composite piece to form a unitary composite article from the first and second composite pieces; and applying a lightning strike protection coating to the unitary composite article by:

applying an electrically conductive coating onto the unitary composite article in flowable form;

pressing a form against the electrically conductive coating applied on the unitary composite article while the electrically conductive coating is flowable, the form comprising a plurality of spaced apart depressions; and curing the electrically conductive coating while the form is pressed against the electrically conductive coating on the unitary composite article to create an impression of the form in the electrically conductive coating that includes a plurality of spaced apart protrusions.

21. The method as set forth in claim 20, wherein the unitary composite article forms a portion of an aircraft exterior.

22. A composite article comprising:
a composite substrate; and
a lightning strike protection coating covering a surface portion of the composite substrate, the lightning strike protection coating comprising an electrically conductive material and including a plurality of spaced apart protrusions along the surface portion;
wherein each of the protrusions comprises one of a conical protrusion and a pyramidal protrusion;
wherein each of the protrusion comprises a conical protrusion having a cone angle in an inclusive range of from about 30° to about 60°.

23. A composite article comprising:
a composite substrate; and
a lightning strike protection coating covering a surface portion of the composite substrate, the lightning strike protection coating comprising an electrically conductive material and including a plurality of spaced apart protrusions along the surface portion;
wherein each of the protrusions comprises one of a conical protrusion and a pyramidal protrusion;
wherein each of the protrusions has a base and a maximum cross-sectional dimension along the base of from about 8 mils to about 40 mils.

24. A composite article comprising:
a composite substrate; and
a lightning strike protection coating covering a surface portion of the composite substrate, the lightning strike protection coating comprising an electrically conductive material and including a plurality of spaced apart protrusions along the surface portion;
wherein each of the protrusions comprises one of a conical protrusion and a pyramidal protrusion;
wherein each of the protrusions has a base and a maximum cross-sectional dimension along the base, wherein adjacent depressions are spaced apart from one another by an on-center spacing distance that is two-times to three-times greater than the maximum cross-sectional dimension.

25. A composite article comprising:
a composite substrate; and
a lightning strike protection coating covering a surface portion of the composite substrate, the lightning strike protection coating comprising an electrically conductive material and including a plurality of spaced apart protrusions along the surface portion;
wherein each of the protrusions has a height of from about 4 mils to about 20 mils.

26. The composite article of claim 25, wherein the protrusions taper to a point.

27. A composite article comprising:
a composite substrate;
a lightning strike protection coating covering a surface portion of the composite substrate, the lightning strike protection coating comprising an electrically conductive material and including a plurality of spaced apart protrusions along the surface portion; and
a paint layer on the lightning strike protection coating, the paint layer having a thickness and each of the protrusions having a height that is about 1 mil to about 3 mils less than the thickness of the paint layer.

28. The composite article of claim 27, wherein the protrusions taper to a point.

29. A release film for use in forming a lightning strike protection coating on a composite article, the release film comprising an inner surface having a plurality of depressions spaced apart along a length and a width of the inner surface, each of the depressions having one of a conical shape and a pyramidal shape, the inner surface being made of material that is configured to release from the lightning strike protection coating after being pressed against the lightning strike protection coating while the lightning strike protection coating cures on the composite article such that an impression of the inner surface is formed on the lightning strike protection coating.

30. The release film as set forth in claim 29, wherein each of the depressions has a depth of from about 4 mils to about 20 mils.

31. The release film as set forth in claim 29, wherein each of the depressions comprises a conical depression having a cone angle in an inclusive range of from about 30° to about 60°.

32. The release film as set forth in claim 29, wherein each of the depressions has a base and a maximum cross-sectional dimension along the base of from about 8 mils to about 40 mils.

33. The release film as set forth in claim 29, wherein each of the depressions has a pointed tip.

34. The release film as set forth in claim 29, wherein each of the depressions has a base and a maximum cross-sectional dimension along the base, wherein adjacent depressions are spaced apart from one another by an on-center spacing distance that is two-times to three-times greater than the maximum cross-sectional dimensions.

35. The release film of claim 29, wherein each of the depressions is a conical depression having a cone angle in an inclusive range of from about 30° to about 60° and has a depth of from about 4 mils to about 20 mils.

36. The release film of claim 29, wherein each of the depressions has a depth of from about 4 mils to about 20 mils, and a base and a maximum cross-sectional dimension along the base of from about 8 mils to about 40 mils.

37. The release film of claim 29, wherein each of the depressions has a pointed tip and a depth of from about 4 mils to about 20 mils.

38. The release film of claim 29, wherein each of the depressions has a depth of from about 4 mils to about 20 mils, wherein each of the depressions has a base and maximum cross-sectional dimension along the base, wherein adjacent depressions are spaced apart from one another by an on-center spacing distance that is two-times to three-times greater than the maximum cross-sectional dimensions.

39. The release film of claim 29, wherein each of the depressions is a conical depression having a cone angle in an inclusive range of from about 30° to about 60°, wherein each of the depressions has a base and a maximum cross-sectional dimension along the base of from about 8 mils to about 40 mils.

40. The release film of claim 29, wherein each of the depressions is a conical depression having a cone angle in an inclusive range of from about 30° to about 60° and a pointed tip.

41. The release film of claim 29, wherein each of the depressions is a conical depression having a cone angle in an inclusive range of from about 30° to about 60°, wherein each of the depressions has a base and a maximum cross-sectional dimension along the base, wherein adjacent depressions are spaced apart from one another by an on-center spacing distance that is two-times to three-times greater than the maximum cross-sectional dimensions.

42. The release film as set forth in claim 29, wherein each of the depressions has a pointed tip, wherein each of the depressions has a base and a maximum cross-sectional dimension along the base of from about 8 mils to about 40 mils.

43. The release film as set forth in claim 29, wherein each of the depressions has a base and a maximum cross-sectional dimension along the base of from about 8 mils to about 40 mils, wherein each of the depressions wherein adjacent depressions are spaced apart from one another by an on-center spacing distance that is two-times to three-times greater than the maximum cross-sectional dimensions.

44. The release film as set forth in claim 29, wherein each of the depressions has a pointed tip, a base, and a maximum cross-sectional dimension along the base, wherein adjacent depressions are spaced apart from one another by an on-center spacing distance that is two-times to three-times greater than the maximum cross-sectional dimensions.

* * * * *